United States Patent [19]

Müller et al.

[11] 4,031,390

[45] June 21, 1977

[54] METHOD OF OPERATING A PARTICLE-BEAM APPARATUS

[75] Inventors: Karl-Heinz Müller; Volker Rindfleisch; Moriz V. Rauch; Dieter Willasch, all of Berlin, Germany

[73] Assignee: Siemens Aktiengesellschaft, Munich, Germany

[22] Filed: Aug. 29, 1973

[21] Appl. No.: 392,526

[30] Foreign Application Priority Data

Sept. 7, 1972 Germany .................. 2344441

[52] U.S. Cl. ................. 250/307; 250/311
[51] Int. Cl.[2] .................. G01N 23/04
[58] Field of Search .......... 250/311, 310, 306, 307, 250/396, 397, 398

[56] References Cited

UNITED STATES PATENTS

| | | | |
|---|---|---|---|
| 2,986,634 | 5/1961 | Le Poole | 250/396 |
| 3,087,057 | 4/1963 | Gutter | 250/398 |
| 3,134,899 | 5/1964 | Guyenot | 250/311 |
| 3,137,791 | 6/1964 | Gutter | 250/311 |
| 3,614,311 | 10/1971 | Fujiyasu | 250/311 |

*Primary Examiner*—Craig E. Church
*Attorney, Agent, or Firm*—Kenyon & Kenyon Reilly Carr & Chapin

[57] ABSTRACT

A method of operating a particle-beam apparatus such as an electron microscope and the like equipped with a deflection system arranged at the beam path and a control device operatively connected to the deflection system includes adjusting the excitation of the deflection system by means of the control device to direct the particle-beam for a selectable time period onto a location of the object whereat the object is to be investigated and, again adjusting the excitation of the deflection system by means of the control device to direct the particle-beam in the remaining time to another location of the object whereat the particle-beam passes through the object, the last-mentioned location being disposed laterally of the first-mentioned location.

4 Claims, 1 Drawing Figure

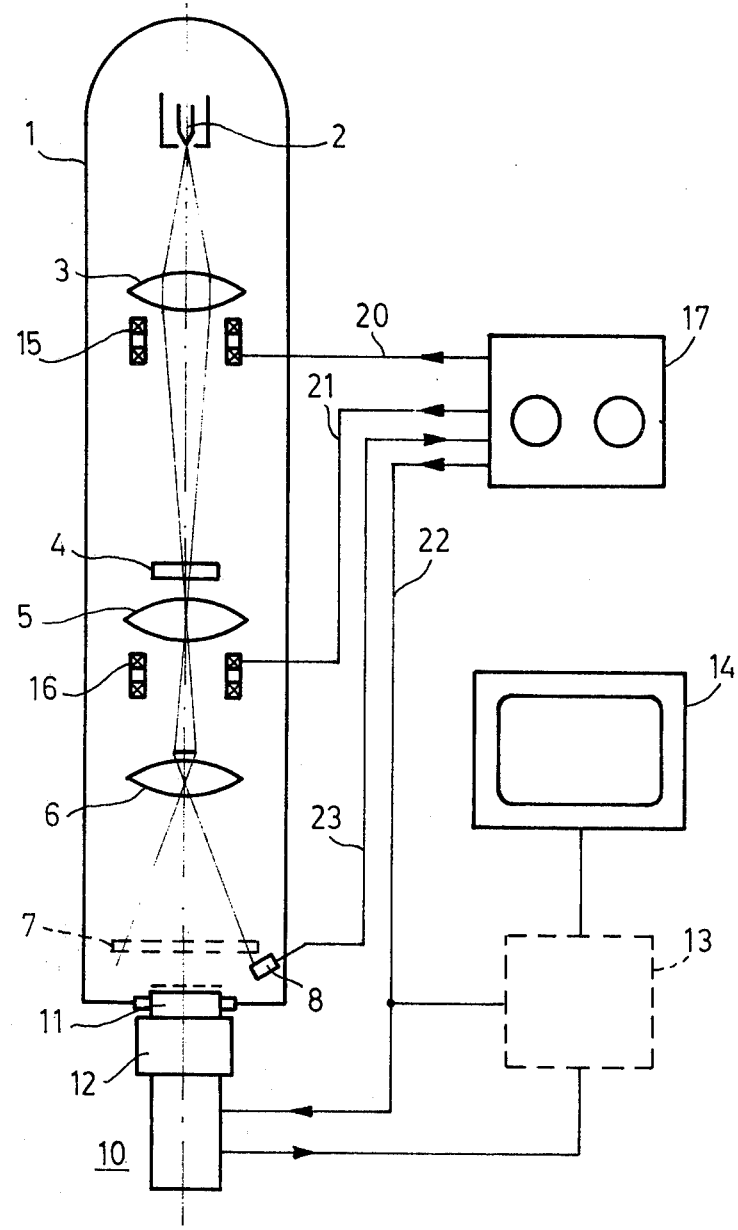

METHOD OF OPERATING A PARTICLE-BEAM APPARATUS

BACKGROUND OF THE INVENTION

When an object is examined by means of a particle-beam apparatus, a certain radiation dose (unit: As/cm$^2$) must not be exceeded so that the test object or the region thereof to be examined is not changed or destroyed. On the other hand, the radiation dose must not fall below a certain value because, then, images of inadequate quality are produced.

SUMMARY OF THE INVENTION

It is an object of the invention to provide a method of operating a particle-beam apparatus which achieves the highest possible picture quality with the lowest possible radiation dose.

the particle-beam apparatus can be an electron microscope or the like and is equipped with a deflection system arranged in the path of the particle-beam. According to the invention, a control device directs the particle-beam onto a location to be investigated by means of the deflection system for a selectable period of time and allows the beam to pass through the object during the rest of the time to one side of the point to be examined.

The method of the invention includes the steps of adjusting the excitation of the deflection system by means of the control device to direct the particle-beam for a selectable time period onto a location of the object whereat the object is to be investigated; and, again adjusting the excitation of the deflection system by means of the control device to direct the particle-beam in the remaining time to another location of the object whereat the particle-beam passes through the object, the last-mentioned location being disposed laterally of the first-mentioned location.

In the method the particle-beam initially impinges on a point located to one side of the object to be examined. Only to obtain a picture of the object at a location thereof which is of special interest, is the particle-beam directed on to this location where it remains only for a limited period of time, until it is returned by the deflection system to the location located to one side. The devices commonly used in electron microscopes can be employed for the recording or registering of the image. A photographic plate, for instance, can be provided. Electronic picture memories can also be used. A television camera with a storage target or a monitor with a long-persistence screen can, for instance be used.

In a further embodiment of the invention, the region of the object irradiated by the particle-beam can be imaged during the time between the recordings or registrations by means of a second deflection system which can be influenced by the control device. Thus as a subsidiary feature, the method of the invention can include the ancillary step of adjusting the excitation of the second deflection system by means of the control device so as to cause the particle-beam to image the region of the object irradiated by the beam.

In this manner, regions in the vicinity of the point to be examined of the object can be viewed whereby the required focussing can be preformed. In the subsequent recording one then obtains a focussed image of a point of the object which had not previously been touched by the particle-beam.

The most careful treatment of the object can be obtained if the duration of the radiation required for the recording is automatically determined by the control device as a function of the intensity of the image. This can be done, for instance, by means of a measuring device which ascertains the intensity of the image. The particle-beam apparatus can be equipped with image recording means for recording an image of the portion of the object being investigated and the control device can be equipped with means for controlling the time required to record image in a self-acting manner in dependance upon the intensity of this image. The method includes the ancillary step of measuring the intensity of the image and supplying the same to the control device.

It is recommended to program the control device so that it provides a control command for the start of the image recording at a time spaced from the control command for irradiating the location to be examined of the object. The method can include the ancillary step of programming the control device to issue a control signal for initiating the recordation of the image of the portion of the object being examined at a predetermined time subsequent to the step of adjusting of the excitation of said deflection system to direct the particle-beam onto the object at the location corresponding to the portion thereof under investigation. This achieves that the result that any electrostatic charge of the object had decayed before the recording of the image starts.

In addition, the control device can be configured so that is images sequentially different irradiated areas of the object and causes them to be recorded. It is thereby possible to obtain a systematic survey of the nature of an object, after the focussing was first performed at a remote point. With these procedures the two deflection systems are given such excitation that the image can always be picked up by the recording device or the image storage device.

The method can include the steps of sequentially adjusting the excitation of the deflection system for sequentially directing the particle-beam onto said locations one at a time and, programming the control device for initiating the recordation of each of the images corresponding to respective ones of the areas after each adjustment of said deflection system.

Although the invention is illustrated and described herein as method of operating a particle-beam apparatus it is nevertheless not intended to be limited to the details shown, since various modifications may be therein within the scope and the range of the claims. The invention, however, together with additional objects and advantages will be best understood from the following description and in connection with the accompanying drawing.

BRIEF DESCRIPTION OF THE DRAWINGS

The drawing shows schematic diagram of an electron-beam microscope and ancillary equipment required to perform the method according to the invention. The view of the electron microscope proper is an outline longitudinal cross-section.

DESCRIPTION OF THE PREFERRED EMBODIMENTS OF THE INVENTION

The housing of the electron microscope is designated with reference numeral 1 and the cathode with 2. A magnetic condensing lens 3 serves for focussing the beam which passes through an object 4. A further objective lens 5 magnifies the image. This image is imaged on a photographic plate 7 by means of a projection lens 6.

In the absense of a photographic plate 7, the final image reaches the entrance aperture of a television camera 10. The camera 10 includes a fiber optics system 11 and an image intensifier 12. With the television camera 10, there is associated an image storage device 13 to which a monitor 14 is connected.

Into the path of the electron-beam are inserted two deflection systems 15 and 16 which are disposed after the magnetic condensing lens 3 and objective lens 5, respectively, as seen in the direction of the beam. Both deflection systems are connected to a control device 17 as indicated by functional lines 20 and 21, respectively. The control device 17 also determines the start of the recording by means of the television camera 10 and the storage device 13 (functional line 22).

The control device 17 contains circuit parts for the current supply of the deflection systems 15 and 16 as well as further circuit parts for the timewise staggered transmission of switching commands to and from the television camera and the storage device. In the quiescent condition, the deflection system is supplied with a current of such magnitude that the electron-beam passes not through the location of the object at which the object is to be examined but, rather, through a location of the object at a distance away therefrom. Provision is made by means of the further deflection system 16 that the electron-beam nevertheless falls on a final image screen or onto the entrance aperture of the television camera 10. The quality of the image per se can thereby be evaluated. Furthermore, the electron microscope can be focussed.

To obtain a high-quality recording of the location to be examined of the object 4, the supply current of the deflection systems 15 and 16 is changed through a control command by means of the control device 17 in such a manner that the electron-beam now passes through the location to be examined of the object. The irradiation lasts as long as is necessary to obtain sufficient image contrast. The duration of the irradiation can be self-preset by the control device 17 as a function of the intensity of the image. For this purpose a measuring device 8 is provided above the television camera 10 and transmits through the connection 23 a signal that corresponds to the exposure time required. The best possible image reproduction is thereby assured with a minimum dose load of the object. It is advisable to program the control device 17 in such a manner that following the deflection of the electron-beam onto the location to be examined, a certain time elapses before the television camera 10 and the storage device 13 begin to operate. Thereby, faults in the image are avoided which can be caused by charging effects of the object.

As already mentioned, the image can be recorded by means of a photographic plate or by means of television camera followed by an image storing device. However, the image can also be stored in the television camera itself if the same is equipped with a storage target. A further possibility of storing the image is to use a monitor with a long-persistence screen. In all cases the required exposure time of the object can be determined with the aid of measuring device 8.

What is claimed is:

1. A method of operating a particle-beam apparatus such as an electron microscope equipped with a controlled deflection system arranged at the beam path, the method comprising adjusting the excitation of the deflection system to direct the particle-beam for a selectable time period onto a location of an object whereat the object is to be investigated; and, again adjusting the excitation of the deflection system to direct the particle-beam in the remaining time to another location of the object whereat the particle-beam passes through the object, the last-mentioned location being disposed laterally of the first mentioned location, said particle-beam apparatus being equipped with a second deflection system, the method comprising the ancillary step of adjusting the excitation of the second deflection system so as to cause the particle-beam to image the region of the object irradiated by the same.

2. The method of claim 1 wherein the particle-beam apparatus is equipped with image recording means for recording an image of the portion of the object being investigated, the method comprising the ancillary step of generating a control signal for initiating the recordation of said image at a predetermined time subsequent to the step of adjusting of the excitation of said deflection system to direct the particle-beam onto the object at the location thereof to be examined.

3. A method of claim 1 wherein the particle-beam apparatus is equipped with image-recording means for recording a plurality of images of respective portions of the object corresponding to respective locations thereon to be investigated comprising sequentially adjusting the excitation of said deflection system for sequentially directing the particle-beam onto said locations one at a time; and the recordation of each of said images after each adjustment of said deflection system.

4. A method of operating a particle-beam apparatus such as an electron microscope equipped with a controlled deflection system arranged at the beam path, the method comprising adjusting the excitation of the deflection system to direct the particle-beam for a selectable time period onto a location of an object whereat the object is to be investigated; and, again adjusting the excitation of the deflection system to direct the particle-beam in the remaining time to another location of the object whereat the particle-beam passes through the object, the last-mentioned location being disposed laterally of the first mentioned location, said particle-beam apparatus being equipped with image recording means for recording an image of the portion of the object being investigated, and a deflection system control means for controlling the time required to record said image in a self-acting manner in dependence upon the intensity of said image, the method comprising the ancillary step of measuring the intensity of said image and supplying the same to the control means.

* * * * *